United States Patent [19]

Yamamoto

[11] Patent Number: 5,306,946
[45] Date of Patent: Apr. 26, 1994

[54] SEMICONDUCTOR DEVICE HAVING A PASSIVATION LAYER WITH SILICON NITRIDE LAYERS

[75] Inventor: Hiroshi Yamamoto, Suwa, Japan

[73] Assignee: Seiko Epson Corporation, Tokyo, Japan

[21] Appl. No.: 775,446

[22] Filed: Oct. 15, 1991

[30] Foreign Application Priority Data

Oct. 15, 1990 [JP] Japan .................. 2-275557

[51] Int. Cl.⁵ .................. J01L 23/290; J01L 23/485
[52] U.S. Cl. .................. 257/640; 257/760
[58] Field of Search ............. 257/758, 760, 759, 773, 257/640, 641, 786

[56] References Cited

U.S. PATENT DOCUMENTS

| | | | |
|---|---|---|---|
| 4,365,264 | 12/1982 | Mukai et al. | 257/759 |
| 4,446,194 | 5/1984 | Candelaria et al. | 428/428 |
| 4,618,878 | 10/1986 | Aoyama et al. | 257/760 |
| 4,723,197 | 2/1988 | Takiar et al. | 257/759 |
| 4,728,627 | 3/1988 | Mase et al. | 257/775 |
| 5,160,998 | 11/1992 | Itoh et al. | 257/760 |

*Primary Examiner*—Rolf Hille
*Assistant Examiner*—Peter Toby Brown
*Attorney, Agent, or Firm*—Oliff & Berridge

[57] ABSTRACT

A semiconductor device is protected by a passivation layer, which includes underlying and overlying silicon nitride layers deposited by the plasma-assisted CVD method by changing layer forming conditions. The silicon nitride layers respectively have their intrinsic compressive stresses. The underlying silicon nitride layer in contact with a metal wiring layer has the intrinsic compressive stress of $3 \times 10^9$ to $1 \times 10^{10}$ dyne/cm². The overlying silicon nitride layer has the intrinsic compressive stress which is less than or equal to half of the intrinsic compressive stress of the underlying silicon nitride layer. The underlying and overlying silicon nitride layers have different degrees of the hydrogen content. The underlying silicon nitride layer has the hydrogen content of $0.5 \times 10^{20}$ to $5 \times 10^{21}$ atm/cm³. The overlying silicon nitride layer has the hydrogen content which is more than or equal to twice of the hydrogen content of the underlying silicon nitride layer.

2 Claims, 2 Drawing Sheets

FIG. I(A)
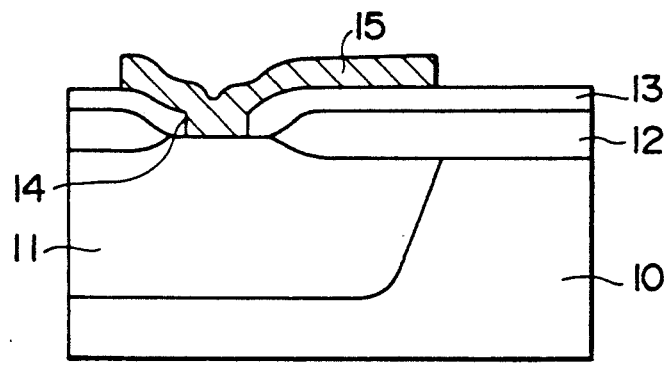
FIG. I(B)
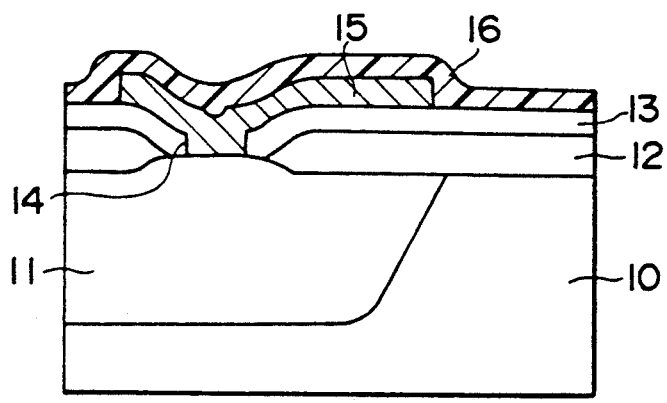
FIG. I(C)
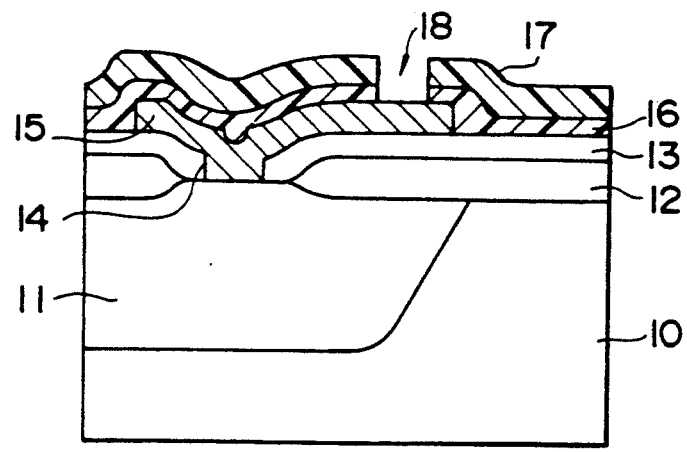

SEMICONDUCTOR DEVICE HAVING A PASSIVATION LAYER WITH SILICON NITRIDE LAYERS

BACKGROUND OF THE INVENTION

1. Field of the Invention

This invention relates to a semiconductor device, and more particularly to an improved passivation layer to be formed on a metal wiring layer of a semiconductor device and a method of fabricating the same.

2. Description of the Related Art

The semiconductor surface and the metal surface layers are usually protected with a covering dielectric. This dielectric is called the passivation layer, and is often the outermost layer of the semiconductor device to protect the device from stress applied during package molding and harmful environment such as contamination and moisture. The passivation layers are sometimes interposed between multiple metal wiring layers to function as interlayer dielectrics.

There are known the passivation layers such as a silicon dioxide layer ($SiO_2$) and a phospo-silicate glass layer (PSG) formed by CVD (chemical vapor deposition), and a silicon nitride layer (P-SiN) and a silicon dioxide layer (P-SiO) formed by PCVD (plasma-assisted chemical vapor deposition).

With minimization of the semiconductor device elements, the passivation layers are required to have various characteristics. Specifically, these characteristics are resistant to thermal and mechanical stress to be applied during the subsequent manufacturing stages after formation of the passivation layers, insulation from the atmospheric conditions, especially moisture, and insulation from alkali metals like $Na^+$. Along with minimization of the semiconductor devices and multiplication of the wiring metal layers, electro-migration (EM) and stress migration (SM) are noted as troubles related to the semiconductor devices. These troubles are found to be resultant from intrinsic stress relative to the passivation layers.

The CVD $SiO_2$ and PSG layers do not satisfy the mechanical strength required for the passiviation layer. Since these layers are formed at relatively high temperatures, they have little hydrogen content and cannot function sufficiently as a protective layer because of insufficient moisture resistivity. With the CVD passivation layer, the intrinsic stress of the layer functions as tensile stress, which causes cracks when the layer is being formed.

With the PCVD P-SiN and P-SiO layers, the intrinsic stress functions as compressive stress, which is useful to suppress cracks during the layer formation. Since these layers are formed at relatively low temperatures, they have larger hydrogen content than the CVD layers, and are superior to the CVD layers in the moisture resistivity.

As for the mechanical strength, the P-SiO layer is inferior to the P-SiN layer but superior to the CVD layers, and is inferior to the P-SiN layer to passivate the minute patterns and to block alkali ions.

Therefore, the P-SiN layer seems superior to the other layers as the passivation layer. However, the P-SiN layer has the intrinsic compressive stress higher than that of the P-SiO layer. The thicker the P-SiN layer, the more the compressive stress. Generally speaking, the passivation layer should be at least 1 $\mu$m thick to prevent pinholes. When it is about 1 $\mu$m thick, the P-SiN layer tends to increase its intrinsic stress, which adversely affects underlying wiring layers, leading to deterioration of resistivity to the electro-stress migration of the minimized semiconductor devices.

When any of these layers is used to form a single passivation layer with a required thickness, the passivation layer does not have all the required properties. To overcome this difficulty, dual layer passivation is proposed in U.S. Pat. No. 4,446,194, for example, which discloses that a first passivation layer is a PCVD P-SiO layer, and a second passivation layer is a CVD $SiO_2$ layer. The first P-SiO layer has the intrinsic stress, which serves as the compressive stress to lessen the residual tensile strength of the metal layer and to reduce void formation due to stress- or electro-migration. This dual layer passivation however does not seem sufficient to improve resistivity to electro-stress migration of extensively minimized semiconductor devices. The double layer structure of the oxide layers does not provide the mechanical strength identical to the mechanical strength of the P-SiN layer, and is rather inferior in the alkali ion blocking capability. The first, $SiO_2$ layer does not have sufficient moisture resistivity causing moisture to enter into a border between the first and second passivation layers. The first and second passivation layers are formed by the different deposition methods, which means reduced throughput of the semiconductor devices.

As described above, the existing passivation layers are rather insufficient for protection of minute metal wiring layers. At present, various efforts have been made to improve the metal wiring layers to overcome the problems related to the electro-stress migration.

SUMMARY OF THE INVENTION

It is an object of this invention to provide a semiconductor device which includes a passivation layer made of a plurality of silicon nitride layers having excellent moisture resistivity, resistivity to stress, electric characteristics, and transistor characteristics, and to provide a method for fabricating a semiconductor device including such passivation layer.

According to a first aspect of this invention, the passivation layer is made of a plurality of plasma-assisted CVD silicon nitride layers, which are formed by changing layer forming conditions to give them different properties. The passivation layer is applicable as an interlayer dielectric between metal wiring layers as well as an outermost protective layer of a semiconductor device.

With this invention, two or more silicon nitride (hereinafter called "P-SiN") layers are used to serve as a multiple passivation layer, thereby satisfying various requirements made on the passivation layer. A single passivation layer is difficult to meet all the requirements for the passivation layer. Specifically, the resistivity to the electro-migration largely depends upon the intrinsic compressive stress, and the moisture resistivity varies with the hydrogen content, which are contradictory to one another. When the passivation layer includes two or more P-SiN layers having different properties, these contradictory properties can be satisfied. These P-SiN layers are formed based on the plasma-assisted CVD method by regulating the layer forming conditions in one plasma-assisted CVD unit, thereby assuring high throughput.

The intrinsic compressive stress and hydrogen content are very important to make an excellent passivation layer. Both these characteristics can be relatively regulated by changing the layer forming conditions, but cannot be improved independently.

To assure the resistivity to the electro-stress migration and excellent moisture resistivity, an underlying P-SiN layer (hereinafter called "a first P-SiN layer") in contact with a metal wiring layer is made to have larger intrinsic compressive stress than the intrinsic compressive stress of an overlying P-SiN layer (hereinafter called "a second P-SiN layer"). The first P-SiN layer should have the intrinsic compressive stress as large as possible not to deteriorate the resistivity to the electro-stress migration, and have large hydrogen content as possible so that the first P-SiN layer can have sufficient moisture resistivity. For this purpose, the first P-SiN layer has the intrinsic compressive stress of $3 \times 10^9$ to $1 \times 10^{10}$ dyne/cm$^2$, and the second P-SiN layer preferably has the intrinsic compressive stress which is less than or equal to half of the intrinsic compressive stress of the first P-SiN layer. When the compressive stress of the first P-SiN layer is above or below the maximum or minimum value, the electro-stress migration of the metal wiring layers may be intensified, or the required moisture resistivity cannot be attained. When the intrinsic compressive stress of the second P-SiN layer is more than half of the intrinsic compressive stress of the first P-SiN layer, the total intrinsic compressive stress of the whole passivation layer will become large enough to undesirably promote the electro-stress migration.

The first P-SiN layer having the desired hydrogen content tends to have a large intrinsic compressive stress. When it is thin, the first P-SiN layer can have the intrinsic compressive stress not to deteriorate the resistivity to the electro-stress migration. This can be done by making the first P-SiN layer thinner than the second P-SiN layer. A plurality of P-SiN layers can constitute one passivation layer of the specified thickness. Overlying P-SiN layers are formed not to have large intrinsic compressive stress by controlling the layer forming conditions. The overlying P-SiN layers are slow to cause cracks since they have intrinsic compressive stress, covering the underlying P-SiN layer having excellent moisture resistivity, thereby keeping the metal wiring layers from being affected by the environment.

To keep the resistivity to the electro-stress migration and moisture resistivity in another way, the hydrogen content of the first P-SiN layer in contact with the metal wiring layer is made less than the hydrogen content of the second P-SiN layer. In this case, the compressive stress of the first P-SiN layer becomes low enough not to reduce the resistivity to the electrostress migration. However, the hydrogen content of the first P-SiN layer is lowered, which is made up for by increasing the hydrogen content of the second P-SiN layer. The hydrogen content of the first P-SiN layer is $0.5 \times 10^{20}$ to $5 \times 10^{21}$ atm/cm$^3$. It is preferable that the second P-SiN layer has the hydrogen content more than or equal to twice the hydrogen content of the first P-SiN layer. If the hydrogen content of the first P-SiN layer is above the maximum value, the intrinsic compressive stress will become too large to prevent the electro-stress migration. If the minimum value is not satisfied, the intrinsic compressive stress of the first P-SiN layer becomes too small to keep resistivity to the electro-stress migration. When the second P-SiN layer has the hydrogen content which is less than twice of the hydrogen content of the first P-SiN layer, the second P-SiN layer cannot have the moisture resistivity necessary as the passivation layer. When it has the hydrogen content to assure the desired moisture resistivity, the second P-SiN layer tends to have a large intrinsic compressive stress. However, when it is thin, the second P-SiN layer can have the intrinsic compressive stress enough to assure the favorable resistivity to the electro-stress migration. In other words, the first P-SiN layer is thicker than the second P-SiN layer.

The passivation layer including a plurality of the P-SiN layers having different characteristics can be formed by the plasma-assisted CVD method by changing at least one of the layer forming conditions such as the pressure and temperature in the reaction chamber, kind and flow rate of a gas, RF power, and distance between the electrodes. Therefore, two different types of the P-SiN layers can be made in one plasma-assisted CVD unit by changing some of the layer forming conditions. In this case, the layer forming conditions can be changed in a stepped manner or gradually.

BRIEF DESCRIPTION OF THE DRAWINGS

FIGS. 1(A) to 1(C) are cross-sectional views showing how a semiconductor device is fabricated according to a first embodiment of this invention;

DETAILED DESCRIPTION

Figure 2:
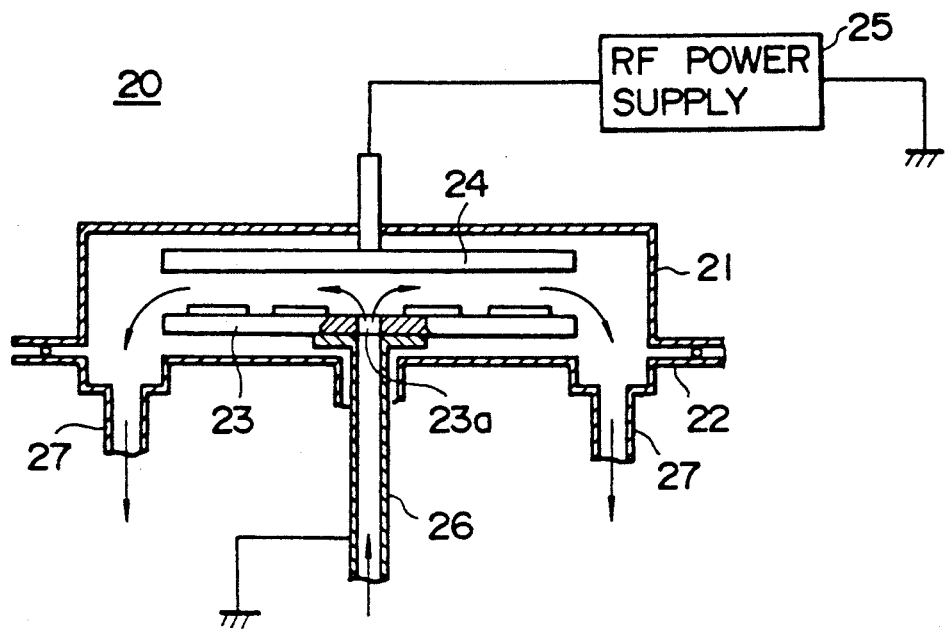
FIG. 2 is a cross-sectional view of a PCVD unit for forming a passivation layer shown in FIG. 1(C)

The structure and fabrication of a semiconductor device of this invention will be described with reference to FIGS. 1.

A LOCOS (local oxidation of silicon) layer 12 is formed on a semiconductor substrate 10 having a well 11. An interlayer dielectric 13 is formed on LOCOS layer 12 and the substrate 10. An etching pattern for a contact hole 14 is formed on the interlayer dielectric 13 by the photolithographic process, and then interlayer dielectric 13 is dry-etched to define the contact hole 14. An aluminum layer containing silicon is sputtered on the interlayer dielectric 13. An etching pattern is formed on the aluminum layer by the photolithographic process. Then an aluminum wiring layer 15 is formed by the dry-etching process.

A passivation layer will be fabricated as follows. As shown in FIG. 2, a PCVD unit 20 is an airtight vessel including upper and lower chambers 21, 22. The airtight vessel houses a parallel-plate electrode, which includes a wafer supporting electrode 23 and a confronting electrode 24. An RF power supply 25 is connected to the electrode 24. A gas is introduced to the parallel-plate electrode via a gas pipe 26 communicating to a hole 23a at the center of the wafer supporting electrode 23. The gas pipe 26 is made of a conductor, also serving to earth the electrode 23. The gas inside the airtight vessel is exhausted via an outlet port 27 disposed around the electrode 23.

The semiconductor substrate 10 having the aluminum wiring layer 15 is introduced into the PCVD unit 20. Then the PCVD unit 20 is vacuumed.

The layer forming conditions are determined so that the first and second P-SiN layers 16, 17 have the following properties. The intrinsic compressive stress of the first P-SiN layer 16 is $3 \times 10^9$ to $1 \times 10^{10}$ dyne/cm$^2$, and the intrinsic compressive stress of the second P-SiN layer 17 is less than or equal to half of the compressive stress of the first P-SiN layer 16, or preferably $0.2 \times 10^9$ to $5 \times 10^9$ dyne/cm$^2$. More preferably, the first P-SiN layer 16 has the intrinsic compressive stress of $3 \times 10^9$ to $8 \times 10^9$ dyne/cm$^2$, and the second P-SiN layer 17 has the compressive stress which is less than or equal to half of the compressive stress of the first P-SiN layer 16, or preferably $0.2 \times 10^9$ to $4 \times 10^9$ dyne/cm$^2$. Further preferably, the first P-SiN layer 16 has the intrinsic compressive stress of $3 \times 10^9$ to $6 \times 10^9$ dyne/cm$^2$, and the second P-SiN layer 17 has the compressive stress less than or equal to half of the compressive stress of the first P-SiN layer 16, or preferably $0.2 \times 10^9$ to $3 \times 10^9$ dyne/cm$^2$.

With this embodiment, the layer forming conditions are gradually determined as shown in TABLE 1 to form the P-SiN layer 16 (FIG. 1(B)) and P-SiN layer 17 (FIG. 1(C)) on the aluminum wiring layer 15.

TABLE 1

|  | First layer 16 | Second layer 17 |
|---|---|---|
| Temperature | 400° C. | 400° C. |
| Pressure | 5 Torr | 5 Torr |
| Flow rate of SiH$_4$ | 150 SCCM | 150 SCCM |
| Flow rate of N$_2$ | 3000 SCCM | 3000 SCCM |
| Flow rate of NH$_3$ | 50 SCCM | 100 SCCM |
| RF power | Approx. 500W | Approx. 300W |

As can be seen from TABLE 1, only the flow rate of NH$_3$ and RF power are different for the layers 16, 17. The layers 16, 17 are formed serially by changing their forming conditions, and then a bonding pad 18 is formed as shown in FIG. 1(C).

The P-SiN layers 16, 17 thus formed have the thicknesses and properties as shown in TABLE 2.

TABLE 2

|  | P-SiN layer 16 | P-SiN layer 17 |
|---|---|---|
| Thickness | 0.3 μm | 0.7 μm |
| Compressive stress | $5 \times 10^9$ dyne/cm$^2$ | $1 \times 10^9$ dyne/cm$^2$ |
| Hydrogen content | $1 \times 10^{22}$ atm/cm$^3$ | $5 \times 10^{20}$ atm/cm$^3$ |

The P-SiN layers 16, 17 are 1 μm thick together, being mechanically strong enough to prevent cracks and pinholes. The P-SiN layers of 1 μm in total thickness also satisfy the following properties.

The first P-SiN layer 16 in contact with the aluminum wiring layer 15 has the hydrogen content of $1 \times 10^{22}$ atm/cm$^3$, which means excellent moisture resistivity. The P-SiN layer 16 has the compressive stress of $5 \times 10^9$ dyne/cm$^2$, assuring sufficient strength without causing any crack in the layer itself. The compressive stress is not so high as to deteriorate the resistivity to the electro-stress migration. If the P-SiN layer 16 having large moisture resistivity, i.e. the hydrogen content of $1 \times 10^{22}$ atm/cm$^3$, is 1 μm thick, the intrinsic compressive stress will increase according to the thickness, making the P-SiN layer 16 less resistant to the electro-stress migration.

The second P-SiN layer 17 of 0.7 μm in thickness is overlaid on the 0.3 μm thick first P-SiN layer 16 to attain the total thickness of 1 μm. Although it has the intrinsic stress of about $1 \times 10^9$ dyne/cm$^3$, the second P-SiN layer 17 does not crack during the layer formation as a CVD layer does, since the stress is compressive. Further, the intrinsic compressive stress of the passivation layer as a whole is kept in a range which does not lessen the resistivity to the electro-stress migration. The second P-SiN layer 17 has the hydrogen content of $5 \times 10^{20}$ atm/cm$^3$ and is somewhat inferior to the P-SiN layer 16 in view of the moisture resistivity. The first P-SiN layer 16 assists to maintain the desired moisture resistivity as a whole.

Both the layers 16, 17 are formed at the temperature of 400° C. These layers can have different degrees of the hydrogen content by changing the flow rate of NH$^3$ and the RF power. This seems mainly because the layers 16, 17 shift in different manners from the plasma state to SiN state.

When it is made only of the P-SiN layer 16 in 1 μm-thickness, the passivation layer has such large stress that the layer is unreliable in the resistivity to the electro-migration of the wiring layers and variation of the transistor characteristics. On the contrary, the P-SiN layer 17 having a small stress is not resistant to the moisture. Both the P-Sin layers 16, 17 having the different properties can satisfy a plurality of requirements cooperatively. Specifically, the layered structure of the passivation layer makes the semiconductor device more reliable with respect to the moisture resistivity, the resistivity to the electro-migration of the metal wiring layers, and variation of the transistor characteristics, and less responsive to stress caused by thermal variations.

Figure 3:
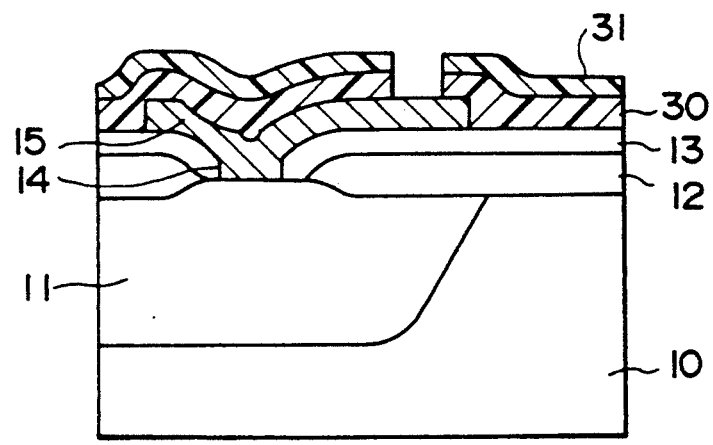
FIG. 3 is a cross-sectional view of a semiconductor device fabricated according a second embodiment of this invention.

FIG. 3 shows a semiconductor device according to another embodiment of this invention. This semiconductor device differs from the semiconductor device of FIG. 1(C) in that the first P-SiN layer 30 is thick and the second P-SiN layer 31 is thin. The other features of the layers 30, 31 are the same as those of the first embodiment (FIG. 1(C)).

The P-SiN layers 30, 31 are serially formed in the PCVD unit 20.

The layer forming conditions are determined so that the first and second P-SiN layers 30, 31 have the following properties. The hydrogen content of the first P-SiN layer 30 is $0.5 \times 10^{20}$ to $5 \times 10^{21}$ atm/cm$^3$, and the hydrogen content of the second P-SiN layer 31 is more than or equal to twice the hydrogen content of the first P-SiN layer 30, or preferably $1 \times 10^{20}$ to $3 \times 10^{22}$ atm/cm$^3$. More preferably, the first P-SiN layer 30 has the hydrogen content of $5 \times 10^{20}$ to $5 \times 10^{21}$ atm/cm$^3$, and the second P-SiN layer 31 has the hydrogen content which is more than or equal to twice of the hydrogen content of the first P-SiN layer 30, or preferably $1 \times 10^{21}$ to $3 \times 10^{22}$ atm/cm$^3$. Further preferably, the first P-SiN layer 30 has the hydrogen content of $7 \times 10^{20}$ to $5 \times 10^{21}$ atm/cm$^3$, and the second P-SiN layer 31 has the hydrogen content more than or equal to twice of the hydrogen content of the first P-SiN layer 30, or preferably $2 \times 10^{21}$ to $3 \times 10^{22}$ atm/cm$^3$.

With this embodiment, the layer forming conditions are as shown in TABLE 3.

TABLE 3

|  | First layer 30 | Second layer 31 |
|---|---|---|
| Temperature | 400° C. | 400° C. |
| Pressure | 5 Torr | 5 Torr |
| Flow rate of SiH$_4$ | 150 SCCM | 150 SCCM |
| Flow rate of N$_2$ | 3000 SCCM | 3000 SCCM |
| Flow rate of NH$_3$ | 100 SCCM | 50 SCCM |
| RF power | Approx. 300W | Approx. 500W |

As can be seen from TABLE 3, the layer forming conditions of the first P-SiN layer 30 are the same as the conditions for the second P-SiN layer 17 of the first embodiment. The second P-SiN layer 31 is formed according to the conditions for the first P-SiN layer 16 of the first embodiment.

The P-SiN layers 30, 31 thus formed have the thickness and properties as shown in TABLE 4.

TABLE 4

|  | P-SiN layer 30 | P-SiN layer 31 |
| --- | --- | --- |
| Thickness | 0.7 μm | 0.3 μm |
| Compressive stress | $1 \times 10^9$ dyne/cm$^2$ | $5 \times 10^9$ dyne/cm$^2$ |
| Hydrogen content | $5 \times 10^{20}$ atm/cm$^3$ | $1 \times 10^{22}$ atm/cm$^3$ |

As shown in TABLE 4, both the layers 30, 31 are 1 μm thick together, being mechanically strong enough to prevent cracks and pinholes caused by external stress. These layers satisfy the following properties as the passivation layer.

The first P-SiN layer 30 in contact with the aluminum wiring layer 15 has the intrinsic compressive stress of $1 \times 10^9$ dyne/cm$^2$ to assure the resistivity to the electro-stress migration, and the hydrogen content of $5 \times 10^{20}$ atm/cm$^3$. The second P-SiN layer 31 has the hydrogen content of $1 \times 10^{22}$ atm/cm$^3$, assuring sufficient moisture resistivity as the passivation layer together with the first layer 30. The layer forming conditions for the second P-SiN layer 31 tend to increase the intrinsic compressive stress. However, the second P-SiN layer 31 is as thin as 0.3 μm, thereby preventing the increase of the intrinsic compressive stress. If the first P-SiN layer 30 having the intrinsic compressive stress of $1 \times 10^9$ dyne/cm$^2$ is made as thick as 1 μm, the hydrogen content becomes too low to realize a passivation layer having good moisture resistivity. According to this embodiment, the two layers 30, 31 demonstrate their physical properties to function as an excellent passivation layer.

In the foregoing embodiments, the layer forming conditions are changed in a stepped manner in one reaction chamber. The P-SiN layers can also be formed by gradually changing the RF power or flow rate of the gas. It is also possible to form the P-SiN layers by two PCVD units. In such a case, a distance between the electrodes can be adjusted as desired. The pressure and temperature may be separately determined in the chambers.

Interrelation between the layer forming conditions and the physical properties of layer materials varies with PCVD units. In the foregoing embodiments, the RF power and the flow rate of the gas are changed to control the stress and hydrogen content of the layers. It is also possible to control characteristics such as insulation as well as the stress and hydrogen content by optimizing other layer forming conditions like the pressure in the chamber, distance between the electrodes, and temperature. Further, a different type of gas can be used to regulate the layer forming conditions. To reduce the hydrogen content in the P-SiN layers, a gas of SiH$_4$—N$_2$—H$_2$ series may be used in place of the SiH$_4$—NH$_3$ gas.

The thickness of the P-SiN layers depend upon factors such as wiring spaces, desired stress value and moisture resistivity. It is also possible to form optimum layers by changing the overall thickness and the ratio of thickness, or adding other layer forming conditions. However, the thickness of the first P-SiN layer 16 should be preferably less than or equal to half of the thickness of the second P-SiN 17 layer to maintain the large hydrogen content and low intrinsic compressive stress of the first P-SiN layer 16. On the contrary, to keep the intrinsic compressive stress of the first P-SiN layer 30 as low as possible and to keep high hydrogen content of the second P-SiN layer 31, the thickness of the first P-SiN layer 30 is preferably more than or equal to twice of the thickness of the second P-SiN layer 31.

When a protective layer such as PSG is formed after the wiring process, or when multiple wiring layers are formed, this invention is applicable to form a passivation layer of polyimide resin to lessen the stress to be applied during the molding process.

What is claimed is:

1. A semiconductor device comprising a passivation layer deposited on a wiring layer, wherein said passivation layer includes a plurality of silicon nitride layers comprising at least one underlying silicon nitride layer and at least one overlying silicon nitride layer, said nitride layers deposited by the plasma-assisted chemical disposition method by changing layer forming conditions to demonstrate different properties, wherein the intrinsic compression stress of said at least one underlying silicon nitride layer is $3 \times 10^9$ to $1 \times 10^{10}$ dyne/cm$^2$, and the intrinsic compressive stress of said at least one overlying silicon nitride layer is less than or equal to half of the intrinsic compressive stress of said at least one underlying silicon nitride layer.

2. A semiconductor device according to claim 1, wherein said at least one underlying silicon nitride layer is thinner than said at least one overlying silicon nitride layer.

* * * * *